(12) United States Patent
Nagata

(10) Patent No.: US 10,580,936 B2
(45) Date of Patent: Mar. 3, 2020

(54) GROUP III NITRIDE SEMICONDUCTOR LIGHT-EMITTING DEVICE AND PRODUCTION METHOD THEREFOR

(71) Applicant: TOYODA GOSEI CO., LTD., Kiyosu-shi (JP)

(72) Inventor: Kengo Nagata, Kiyosu (JP)

(73) Assignee: TOYODA GOSEI CO., LTD., Kiyosu-Shi, Aichi-ken (JP)

(*) Notice: Subject to any disclaimer, the term of this patent is extended or adjusted under 35 U.S.C. 154(b) by 0 days.

(21) Appl. No.: 16/122,679

(22) Filed: Sep. 5, 2018

(65) Prior Publication Data

US 2019/0081212 A1    Mar. 14, 2019

(30) Foreign Application Priority Data

Sep. 12, 2017    (JP) ................ 2017-175240

(51) Int. Cl.
| | |
|---|---|
| *H01L 33/32* | (2010.01) |
| *H01L 33/14* | (2010.01) |
| *H01L 33/42* | (2010.01) |
| *H01L 33/12* | (2010.01) |

(52) U.S. Cl.
CPC ............ *H01L 33/325* (2013.01); *H01L 33/12* (2013.01); *H01L 33/145* (2013.01); *H01L 33/42* (2013.01); *H01L 33/32* (2013.01)

(58) Field of Classification Search
CPC ..... H01L 33/325; H01L 33/145; H01L 33/42; H01L 33/12
See application file for complete search history.

(56) References Cited

U.S. PATENT DOCUMENTS

| | | | |
|---|---|---|---|
| 6,107,647 A | * | 8/2000 | Matsumoto ............ H01L 33/02 257/102 |
| 9,006,706 B2 | | 4/2015 | Hung et al. |
| 2014/0029636 A1 | | 1/2014 | Hung et al. |

FOREIGN PATENT DOCUMENTS

JP    2014-027240 A    2/2014

* cited by examiner

*Primary Examiner* — Dung A. Le

(74) *Attorney, Agent, or Firm* — McGinn I.P. Law Group, PLLC.

(57) ABSTRACT

In a deep ultraviolet light-emitting device comprising a Group III nitride semiconductor, the concentrations of electrons and holes injected into a light-emitting layer is improved. A barrier layer has a last barrier layer closest to an electron blocking layer. The electron blocking layer has a first electron blocking layer closest to a light-emitting layer. The last barrier layer has a first position farthest from the first electron blocking layer, and a second position as an interface with the first electron blocking layer. The first electron blocking layer has a third position farthest from the last barrier layer. The Al composition ratio at the first position is higher than the Al composition ratio at the second position. The Al composition ratio at the third position is higher than the Al composition ratio at the first and second positions.

17 Claims, 4 Drawing Sheets

GROUP III NITRIDE SEMICONDUCTOR LIGHT-EMITTING DEVICE AND PRODUCTION METHOD THEREFOR

BACKGROUND OF THE INVENTION

Field of the Invention

The present techniques relate to a Group III nitride semiconductor light-emitting device and a production method therefor.

Background Art

In the semiconductor light-emitting device, electrons and holes are recombined in the well layer of the light-emitting layer to emit light. To improve emission efficiency, the concentrations of electrons and holes in the well layer are preferably increased.

Therefore, the techniques to efficiently inject holes into the light-emitting layer have been developed. For example, Japanese Patent Application Laid-Open (kokai) No. 2014-027240 discloses a semiconductor light-emitting device in which the bandgap energy of the first portion 41 of the second intermediate layer 46 on the light-emitting layer 30 side is less than the bandgap energy of the second portion 42 of the second intermediate layer 46 on the p-type semiconductor layer 20 side (paragraph [0028]). Thereby, the injection efficiency of carriers into the light-emitting layer 30 increases (paragraph [0030]).

In a deep ultraviolet light-emitting device, generally, the concentration of holes is low. For example, the concentration of holes in p-type AlGaN is extremely low. Therefore, electrons may overflow from the light-emitting layer to the semiconductor layer adjacent to the light-emitting layer. As a result, the carriers existing in the light-emitting layer decease. This causes the decrease of emission efficiency. Therefore, the overflow of electrons is preferably suppressed.

SUMMARY OF THE INVENTION

The present techniques have been conceived for solving the aforementioned problems involved in conventional techniques. Thus, an object of the present techniques is to provide a Group III nitride semiconductor light-emitting device which is intended to suppress the overflow of electrons and control the concentrations of electrons and holes injected into a light-emitting layer in a deep ultraviolet light-emitting device, and a production method therefor.

In a first aspect of the present techniques, there is provided a Group III nitride semiconductor light-emitting device including a first conductive type first semiconductor layer, a light-emitting layer on the first semiconductor layer, and a second conductive type second semiconductor layer on the light-emitting layer. The light-emitting layer has a plurality of barrier layers and well layers. The second semiconductor layer has an electron blocking layer. The plurality of barrier layers has a last barrier layer closest to the electron blocking layer. The electron blocking layer has a first electron blocking layer closest to the light-emitting layer. The last barrier layer has a first position farthest from the first electron blocking layer and a second position as an interface with the first electron blocking layer. The first electron blocking layer has a third position farthest from the last barrier layer. The Al composition ratio at the first position is higher than the Al composition ratio at the second position. The Al composition ratio at the third position is higher than the Al composition ratio at the first and second positions.

In the Group III nitride semiconductor light-emitting device, the reduction of barrier function in the last barrier layer can be prevented. Thereby, the escape of electrons to the electron blocking layer can be suppressed. Holes are easy to be injected into the well layer of the light-emitting layer. That is, the injection efficiency of the semiconductor light-emitting device is high.

The present techniques, disclosed in the specification, provide a Group III nitride semiconductor light-emitting device which is intended to suppress the overflow of electrons and control the concentrations of electrons and holes injected into a light-emitting layer in a deep ultraviolet light-emitting device, and a production method therefor.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENT

Figure 1:
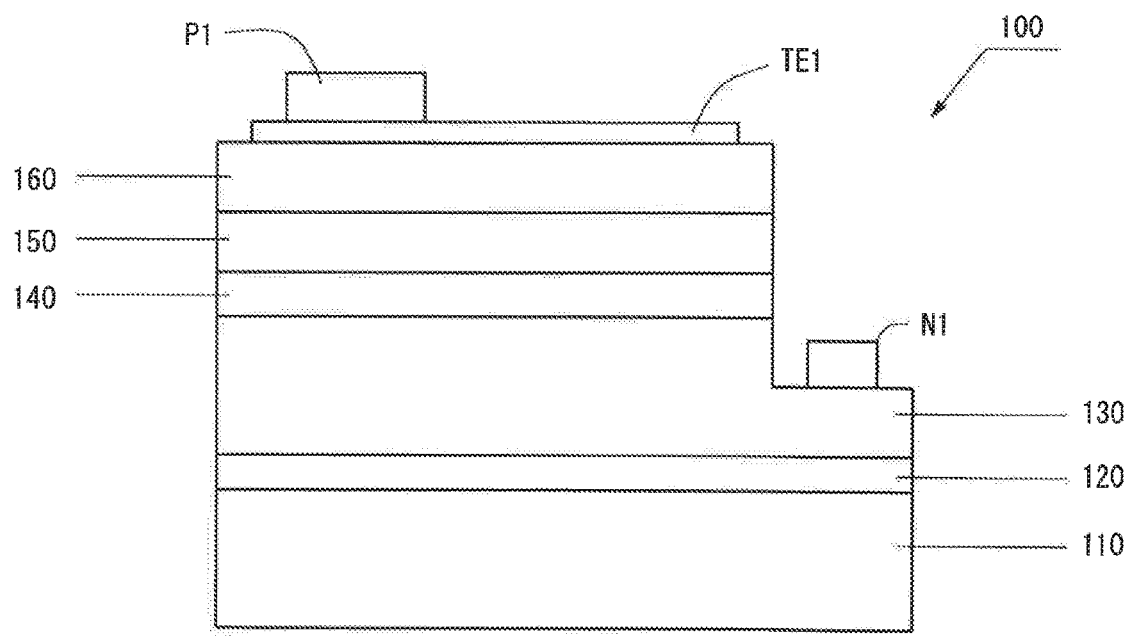
FIG. 1 is a schematic view of the structure of a semiconductor light-emitting device of a first embodiment.

With reference to the drawings, specific embodiment of a Group III nitride semiconductor light-emitting device and a production method therefor as an example will next be described in detail. However, this embodiment should not be construed as limiting the techniques thereto. However, this embodiment should not be construed as limiting the techniques thereto. The below-described depositing structure of the layers of the semiconductor light-emitting device and the electrode structure are given only for the illustration purpose, and other depositing structures differing therefrom may also be employed. The thickness of each of the layers shown in the drawings is not an actual value, but a conceptual value.

First Embodiment

1. Semiconductor Light-emitting Device

FIG. 1 shows a schematic view of the structure of a light-emitting device 100 of a first embodiment. The light-emitting device 100 is a face-up type deep ultraviolet light-emitting device. In the specification, deep ultraviolet refers to light with a wavelength of 210 nm to 360 nm. The light-emitting device 100 has a plurality of semiconductor layers comprising Group III nitride semiconductor. As shown in FIG. 1, the light-emitting device includes a substrate 110, a buffer layer 120, an n-type contact layer 130, a light-emitting layer 140, an electron blocking layer 150, a p-type contact layer 160, a transparent electrode TE1, a p-electrode P1, and an n-electrode N1.

On the main surface of the substrate 110, the buffer layer 120, the n-type contact layer 130, the light-emitting layer 140, the electron blocking layer 150, and the p-type contact layer 160 are formed in this order. The n-electrode N1 is formed on the n-type contact layer 130. The p-electrode P1 is formed on the transparent electrode TE1.

The n-type contact layer 130 is an n-type semiconductor layer. The electron blocking layer 150 and the p-type contact layer 160 are p-type semiconductor layers. These layers may partially include undoped layer. In this way, the light-emitting device 100 includes an n-type semiconductor layer, a light-emitting layer on the n-type semiconductor layer, a p-type semiconductor layer on the light-emitting layer, a transparent electrode TE1 on the p-type semiconductor layer, a p-electrode P1 on the transparent electrode TE1, and an n-electrode N1 on the n-type semiconductor layer.

The n-type semiconductor layer is a first conductive type first semiconductor layer. The p-type semiconductor layer is a second conductive type second semiconductor layer.

The substrate 110 is a support substrate to support semiconductor layers. The substrate 110 has a main surface. The main surface of the substrate 110 may be flat or have an uneven shape. The substrate 110 may be formed of sapphire or any other material such as Si, SiC, and ZnO than sapphire. The substrate 110 may be, needless to say, a growth substrate.

The buffer layer 120 is a layer which takes over the lattice structure of the main surface of the substrate 110 to some extend and becomes a growth core for growing an n-type contact layer 130. The buffer layer 120 is a low temperature growth AlN layer, a high temperature growth AlN layer, and a low or high temperature growth AlGaN layer. The buffer layer 120 may include these layers.

The n-type contact layer 130 is, for example, an n-type AlGaN layer doped with Si. The n-type contact layer 130 is formed on the buffer layer 120. The n-type contact layer 130 is in contact with the n-electrode N1.

The light-emitting layer 140 emits light through recombination of electrons and holes. The light-emitting layer 140 is formed on the n-type contact layer 130. The light-emitting layer 140 has a plurality of barrier layers and well layers. The well layer is, for example, an AlGaN layer. The barrier layer is, for example, an AlGaN layer. The Al composition ratio of the barrier layer is higher than the Al composition ratio of the well layer. These are given as examples, and other AlInGaN layer may be used.

The electron blocking layer 150 is formed on the light-emitting layer 140. The electron blocking layer 150 is a layer to prevent the diffusion of electrons into the p-type contact layer 160 side. The electron blocking layer 150 has the first electron blocking layer 151 and the second electron blocking layer 152 on the first electron blocking layer 151. The electron blocking layer 150 is formed, for example, by depositing a plurality of p-type AlGaN layers. The Al composition ratio and the Mg concentration may be different between a first p-type AlGaN layer and a second p-type AlGaN layer.

The p-type contact layer 160 is a semiconductor layer electrically connected to the p-electrode P1. Therefore, the p-type contact layer 160 is in contact with the p-electrode P1. The p-type contact layer 160 is formed on the electron blocking layer 150. The p-type contact layer 160 is, for example, a p-type GaN layer or a p-type AlGaN layer, each of which is doped with Mg.

The transparent electrode TE1 is formed on the p-type contact layer 160. The transparent electrode TE1 is made of ITO. Other than ITO, transparent conductive oxide such as IZO, ICO, ZnO, $TiO_2$, $NbTiO_2$, and $TaTiO_2$ may be used.

The p-electrode P1 is formed on the transparent electrode TE1. The p-electrode P1 is electrically connected to the p-type contact layer 160 via the transparent electrode TE1. The p-electrode P1 is, for example, a metal electrode comprising a metal such as Ni, Au, Ag, Co, and In.

The n-electrode N1 is formed on the n-type contact layer 130. The n-electrode N1 is in contact with the n-type contact layer 130. The n-electrode N1 is a metal electrode comprising a metal such as Ni, Au, Ag, Co, and In.

Figure 2:
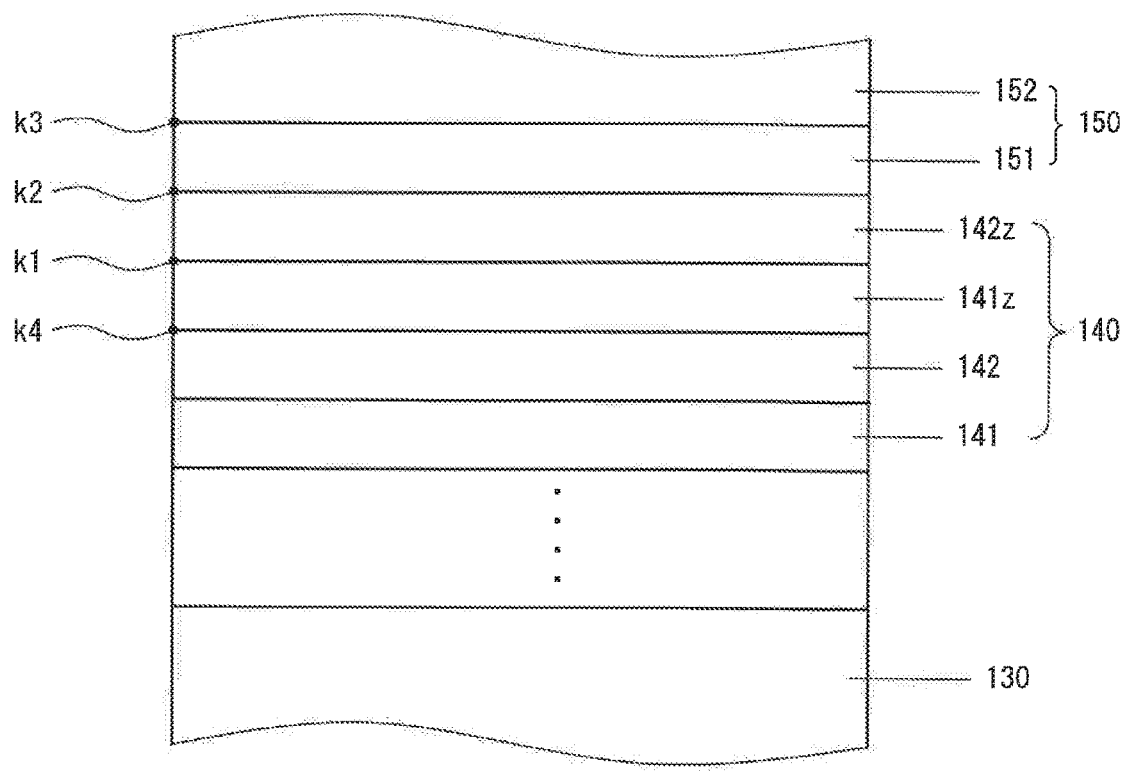
FIG. 2 is a view of the structure in the vicinity of a light-emitting layer of the semiconductor light-emitting device of the first embodiment.

2. Structure and Al Composition Ratio of Light-emitting Layer 2-1. Structure of Light-emitting Layer FIG. 2 is a view showing the structure in the vicinity of a light-emitting layer 140 of the light-emitting device 100. As shown in FIG. 2, the light-emitting layer 140 has a structure in which a well layer 141 and a barrier layer 142 are alternately repeated. One barrier layer among the barrier layers 142, which is closest to the electron blocking layer 150, is defined as a last barrier layer 142z. One well layer among the well layers 141, which is closest to the last barrier layer 142z, is defined as a last well layer 141z. The first electron blocking layer 151 of the electron blocking layers 150 is a layer closest to the light-emitting layer 140. The first electron blocking layer 151 is adjacent to the last barrier layer 142z.

The last barrier layer 142z has a first position k1 farthest from the first electron blocking layer 151 and a second position k2 as a boundary with the first electron blocking layer 151. The first position k1 is a boundary between the last well layer 141z and the last barrier layer 142z. The second position k2 is a boundary between the last barrier layer 142z and the first electron blocking layer 151. The first electron blocking layer 151 has a third position k3 farthest form the last barrier layer 142z. The third position k3 is a boundary between the first electron blocking layer 151 and the second electron blocking layer 152 thereon. The barrier layer 142 which is disposed so as to interpose the last well layer 141z between the barrier layer 142 and the last barrier layer 142z has a fourth position k4. The fourth position k4 is a boundary between the last well layer 141z and the barrier layer 142 nearest from the last well layer 141z.

2-2. Al Composition Ratio

Figure 3:
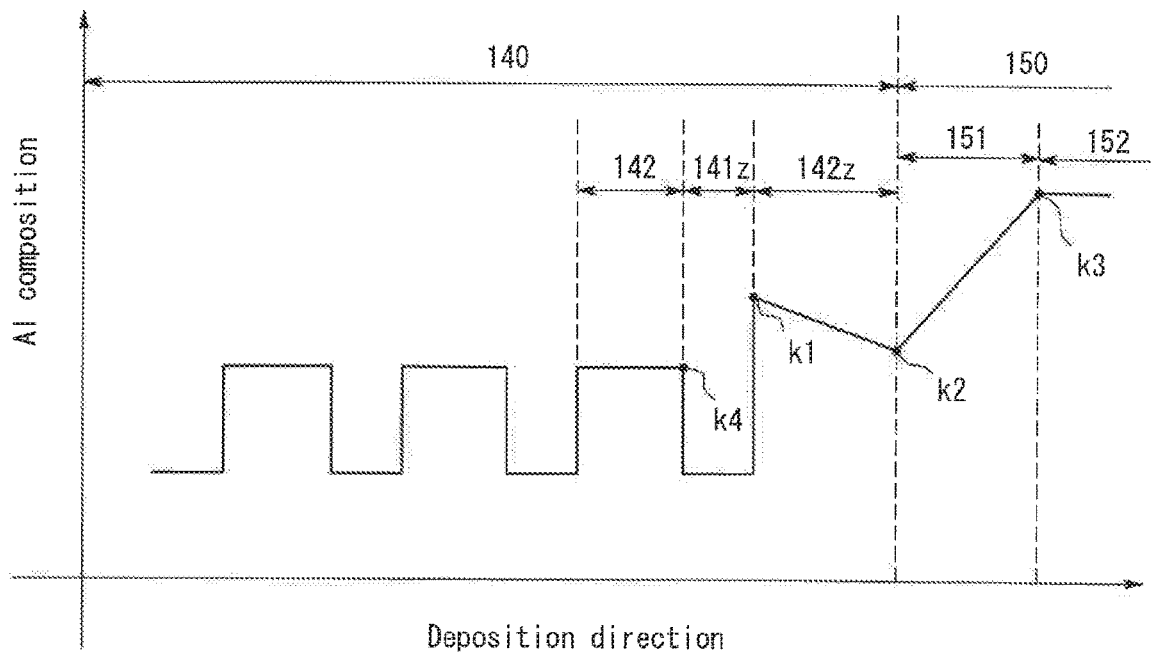
FIG. 3 is a graph showing the Al composition ratio in the vicinity of the light-emitting layer of the semiconductor light-emitting device of the first embodiment.

FIG. 3 is a graph showing the Al composition ratio in the light-emitting layer 140 and the vicinity of the light-emitting layer 140 of the light-emitting device 100. The horizontal axis of FIG. 3 indicates positions in a semiconductor deposition direction perpendicular to the plate surface of the substrate 110. The vertical axis of FIG. 3 indicates the Al composition ratio. As shown in FIG. 3, in the light-emitting layer 140, the well layer 141 and the barrier layer 142 have different Al composition ratio. The Al composition ratio of the barrier layer 142 is higher than the Al composition ratio of the well layer 141. The Al composition ratio of the last barrier layer 142z is higher than the Al composition ratio of other barrier layer 142.

As shown in FIG. 3, the Al composition ratio at the first position k1 is higher than the Al composition ratio at the second position k2. The Al composition ratio at the third position k3 is higher than the Al composition ratio at the first position k1 and the second position k2. The Al composition ratio at the first position k1, the second position k2, and the third position k3 are higher than the Al composition ratio at the fourth position k4. That is, the Al composition ratio is higher in the order of the third position k3, the first position k1, the second position k2, and the fourth position k4. With respect to the Al composition ratios, ratio at K4<ratio at K2<ratio at K1<ratio at K3 is satisfied.

The Al composition ratio in the last barrier layer 142z linearly decreases from the first position k1 to the second position k2. The Al composition ratio in the first electron blocking layer 151 linearly increases from the second position k2 to the third position k3. However, the V-shaped (decrease-increase) variation of the Al composition ratio is not necessary to be linear. The Al composition ratio may be varied along a curve, e.g., letter "U" shape, conic curve or step-wise. The Al composition ratio at the second position k2 is any value in a range from 55% to 65%. The Al composition ratio at the first position k1 may be 58% to 70%, more preferably 61% to 68%. The Al composition ratio at the third position k3 may be 75% to 85%, more preferably 78% to 83%. The Al composition ratio at the fourth position k4 may be 55% to 65%, more preferably 57% to 62%. The Al composition ratio at the first position k1 may be 1.05 to 1.3 times as large as the Al composition ratio at the fourth position k4. The details are described later.

2-3. Effect of Al Composition Ratio

Since the Al composition ratio at the first position k1 of the last barrier layer 142z is higher than the Al composition ratio at the fourth position k4 of the other barrier layers 142, electrons are preferably confined in the light-emitting layer 140. The Al composition ratio at the second position k2 as a boundary between the last barrier layer 142z and the first electron blocking layer 151 is sufficiently lower than the Al composition ratio at the first position k1, holes are effectively injected in the light-emitting layer 140 through the last well layer 141z. Alternatively, the function of blocking electrons at the first electron blocking layer 151 is slightly deteriorated. The Al composition ratio at the third position k3 of the first electron blocking layer 151 is preferably higher than the Al composition ratio of the conventional electron blocking layer.

Especially in the deep ultraviolet light-emitting device, the p-type semiconductor layer has lower hole concentration compared to other light-emitting device having a long wavelength. However, from the above effect, in the light-emitting device 100, holes are efficiently injected in the light-emitting layer 140 through the last well layer 141z. That is, the hole injection rate of the light-emitting device 100 is high.

3. Method for Producing Semiconductor Light-emitting Device

The production method comprises steps of forming a first conductive type first semiconductor layer, forming a light-emitting layer on the first semiconductor layer, and forming a second conductive type second semiconductor layer on the light-emitting layer. The light-emitting layer formation step includes a barrier layer formation step of forming a plurality of barrier layers, and a well layer formation step of forming a well layer. The second semiconductor layer formation step includes an electron blocking layer formation step of forming an electron blocking layer.

The carrier gas employed is hydrogen ($H_2$), nitrogen ($N_2$) or a mixture of hydrogen and nitrogen ($H_2+N_2$). In the steps described later, unless otherwise specified, any of these may be employed. Ammonia gas ($NH_3$) is used as a nitrogen source. Trimethylgallium ($Ga(CH_3)_3$: "TMG") is used as a gallium source. Trimethylaluminum ($Al(CH_3)_3$: "TMA") is used as an aluminum source. Silane ($SiH_4$) is used as an n-type dopant gas. Bis(cyclopentadienyl)magnesium ($Mg(C_5H_5)_2$) is used as a p-type dopant gas.

3-1. Substrate Preparation Step

Firstly, a substrate 110 is prepared. Subsequently, the substrate 110 is placed, for example, on a susceptor in the MOCVD chamber.

3-2. Substrate Cleaning Step

The substrate is heated to a temperature of 1,000° C. or more. Hydrogen gas is supplied into the chamber. Thereby, the main surface of the substrate 110 is cleaned and reduced.

3-3. Buffer Layer Formation Step

A buffer layer 120 is formed on the substrate 110. As a buffer layer 120, any one of a low temperature growth AlN layer, a high temperature growth AlN layer, and a low or high temperature growth AlGaN layer is formed. Alternatively, a plurality of these layers may be formed.

3-4. N-type Contact Layer Formation Step

An n-type contact layer 130 is formed on the buffer layer 120. In this step, the substrate temperature is in a range of 900° C. to 1,200° C.

3-5. Light-emitting Layer Formation Step

A light-emitting layer 140 is formed on the n-type contact layer 130. In this step, a well layer 141 and a barrier layer 142 are alternately deposited. That is, the light-emitting layer formation step includes a barrier layer formation step of forming a plurality of barrier layers 142 and a well layer formation step of forming a plurality of well layers 141. In the well layer formation step, the last well layer 141z is formed at a position farthest from the n-type semiconductor layer. In the barrier layer formation step, a last barrier layer 142z is formed at a position farthest from the n-type semiconductor layer. The substrate temperature is in a range of 900° C. to 1,200° C.

A last barrier layer 142z is formed so that the Al composition ratio of the last barrier layer 142z is higher than the Al composition ratio of other barrier layers 142. When the last barrier layer 142z is formed, the Al composition ratio is gradually decreased from the start to the end. However, the Al composition ratio at the end of the formation of the last barrier layer 142z is made higher than the Al composition ratio of other barrier layers 142. The Al composition ratio at the second position k2 is 55% to 65%.

When the last barrier layer 142z is formed, the first position k1 farthest from the first electron blocking layer 151 and the second position k2 as a boundary between the last barrier layer 142z and the first electron blocking layer 151 are formed. As described above, the Al composition ratio at the first position k1 is made higher than the Al composition ratio at the second position k2.

3-6. Electron Blocking Layer Formation Step

An electron blocking layer 150 is formed on the barrier layer 142 of the light-emitting layer 140. As an electron blocking layer 150, for example, a p-type AlGaN layer is formed.

After the formation of the last barrier layer 142z, a first electron blocking layer 151 is formed in adjacent to the last barrier layer 142z. When the first electron blocking layer 151 is formed, the Al composition ratio of the first electron blocking layer 151 is gradually increased starting from the Al composition ratio at the second position k2, i.e., end position, of the last barrier layer 142z.

Thus, the Al composition ratio gradually decreases from the start position (first position k1) of the last barrier layer 142z. The Al composition ratio turns from decrease to increase at the end position (second position k2) of the last barrier layer 142z. As described above, the Al composition ratio at the end position (third position k3) of the first electron blocking layer 151 is made higher than the Al composition ratio at the start position (first position k1) of the last barrier layer 142z.

When the first electron blocking layer 151 is formed, a third position k3 farthest from the last barrier layer 142z is formed. The Al composition ratio at the third position k3 is made higher than the Al composition ratio at the first position k1 and the second position k2. In this way, the Al composition ratio in the last barrier layer 142z and the first electron blocking layer 151 is decreased from the first position k1 to the second position k2, and is increased from the second position k2 to the third position k3.

3-7. P-type Contact Layer Formation Step

A p-type contact layer 160 is formed on the electron blocking layer 150. As a p-type contact layer 160, for example, a p-type GaN layer or a p-type AlGaN layer is formed. As a carrier gas, at least hydrogen gas may be supplied. This improves the surface flatness of the p-type contact layer 160. The substrate temperature is in a range of 800° C. to 1,200° C. A heat treatment for decreasing resistivity of p-type semiconductor layers is performed.

3-8. Transparent Electrode Formation Step

A transparent electrode TE1 is formed on the p-type contact layer 160. In this step, sputtering or a vapor deposition technique may be employed.

3-9. Electrode Formation Step

The semiconductor layers are partially removed through laser radiation or etching from the p-type contact layer 160 side, to thereby expose the n-type contact layer 130. Then, the n-electrode N1 is formed on the thus-exposed region. A p-electrode P1 is formed on the transparent electrode TE1. Either of the p-electrode P1 formation step and the n-electrode N1 formation step may be performed first.

3-10. Other Steps

In addition to the aforementioned steps, additional steps such as a step of covering the device with an insulating film and a heat treatment step may be carried out. In this way, the light-emitting device 100 shown in FIG. 1 is produced.

4. Comparison Between the First Embodiment and the Conventional Techniques

Figure 4A:
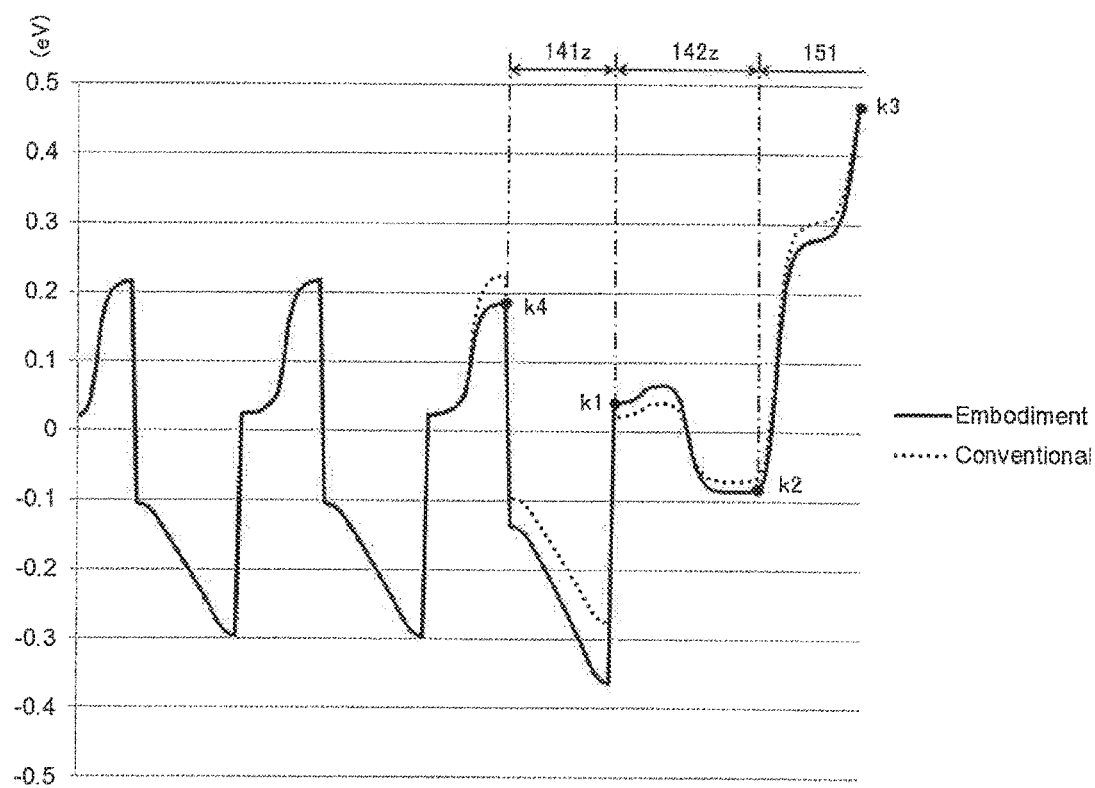
FIG. 4A is a graph showing the conduction band structure in the vicinity of the light-emitting layer of the semiconductor light-emitting devices of the first embodiment and the conventional example.
Figure 4B:
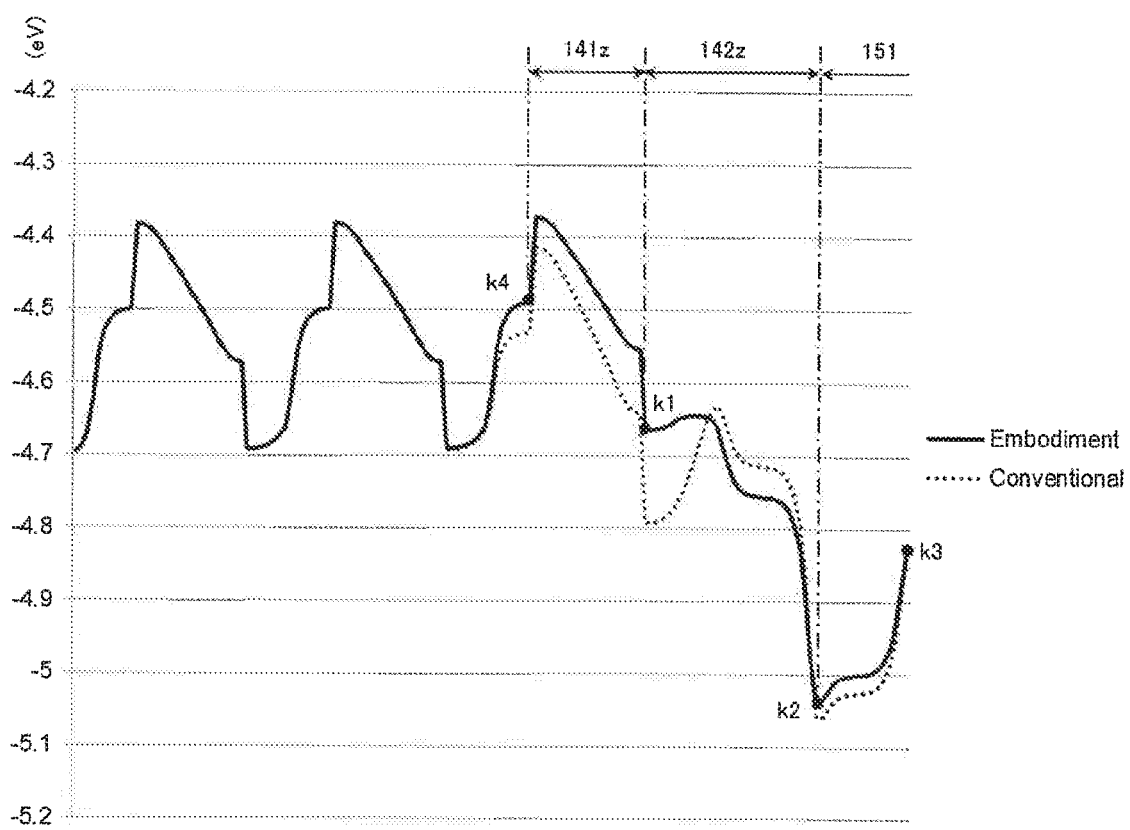
FIG. 4B is a graph showing the valence band structure in the vicinity of the light-emitting layer of the semiconductor light-emitting devices of the first embodiment and the conventional example.

In the conventional light-emitting device, the Al composition ratios of all well layers and all barrier layers are constant and the Al composition ratio of the layer corresponding to the first electron blocking layer 151 monotonously increases from 60% to 80% in a direction from the light emitting layer to the p-type contact layer. FIG. 4A is a graph comparing the conduction bands between the light-emitting device 100 of the first embodiment and the conventional light-emitting device. FIG. 4B is a graph comparing the valence bands between the light-emitting device 100 of the first embodiment and the conventional light-emitting device. The graphs show band diagrams at an applied voltage of 4.45 V. The light-emitting layer 140 and the vicinity of the light-emitting layer 140 are extracted in FIGS. 4A and 4B. The horizontal axis of FIGS. 4A and 4B indicates positions in a semiconductor deposition direction perpendicular to the plate surface of the substrate in the light-emitting device. The vertical axis of FIG. 4A indicates the energy level (eV) of the conduction band. The vertical axis of FIG. 4B indicates the energy level (eV) of the valence band. The level of 0 eV in FIGS. 4A and 4B means the bottom energy level of the conduction band of the n-type contact layer 130. The solid line of FIG. 4A indicates the energy level of the conduction band of the light-emitting device 100 of the first embodiment. The solid line of FIG. 4B indicates the energy level of the valence band of the light-emitting device 100 of the first embodiment. The dotted line of FIG. 4A indicates the energy level of the conduction band of the conventional light-emitting device. The dotted line of FIG. 4B indicates the energy level of the valence band of the conventional light-emitting device. These show the values obtained by simulation. In FIGS. 4A and 4B, the respective energy levels of the conduction band and the valence band of the well layers 141 including the last well layer 141z, the barrier layers 142 including the last barrier layer 142z, and the first electron blocking layer 151 are inclined due to piezo electric field generated by crystal distortion and applied external voltage though the diagram of the Al composition ratio is not inclined in FIG. 3.

As shown in FIG. 4A, in the light-emitting device 100 of the first embodiment, the last barrier layer 142z has a sufficiently high barrier height. The barrier height of the last barrier layer 142z is 0.406 eV at the first position k1 in the first embodiment. The barrier height of the last barrier layer is 0.299 eV at the first position in the conventional example. Therefore, the barrier height of the last barrier layer 142z is higher by 0.107 eV (in difference), i.e., 36% (in ratio) than the barrier height in the conventional example. The energy level at the first position k1 is 0.0405 eV in the first embodiment, and 0.0218 eV in the conventional example. Therefore, the energy level at the first position k1 in the first embodiment is higher by 0.0187 eV than that in the conventional example. Thus, in the conventional light-emitting device, electrons cannot be sufficiently blocked. On the other hand, in the light-emitting device 100 of the first embodiment, diffusion of electrons to the p-type semiconductor layer can be preferably suppressed.

As shown in FIG. 4B, the energy level of the valance band at the second position k2 is −5.04 eV in the first embodiment, and −5.06 eV in the conventional example. Therefore, the energy level of the valence band in the first embodiment is lower by 0.02 eV than that in the conventional example. In the vicinity of the first position k1 of the last barrier layer 142z, a hole injection barrier of 0.02 eV exists in the first embodiment, and a hole injection barrier of 0.16 eV exists in the conventional example. Therefore, the barrier to hole injection in the last barrier layer 142z is lower by 0.16 eV (in difference) than that in the conventional example. This equivalently means that the barrier existed in the last barrier layer in the conventional example does not exist in the first embodiment. That is, in the light-emitting device 100 of the first embodiment, the barrier height for holes of the last barrier layer 142z is sufficiently low at the first position of k1. In the conventional light-emitting device, with respect to the barrier height for holes, the barrier layer closest to the electron blocking layer has a barrier with a height higher than the barrier height at the first position of k1 in the light-emitting device 100 of the first embodiment. Therefore, in the conventional light-emitting device, holes cannot be sufficiently injected in to the well layers. On the other hand, in the light-emitting device 100 of the first embodiment, holes can be sufficiently injected into the last well layer 141z and other well layers 141 from the p-type contact layer 160 and the first electron blocking layer 151 through the last barrier layer 142z.

Figure 5:
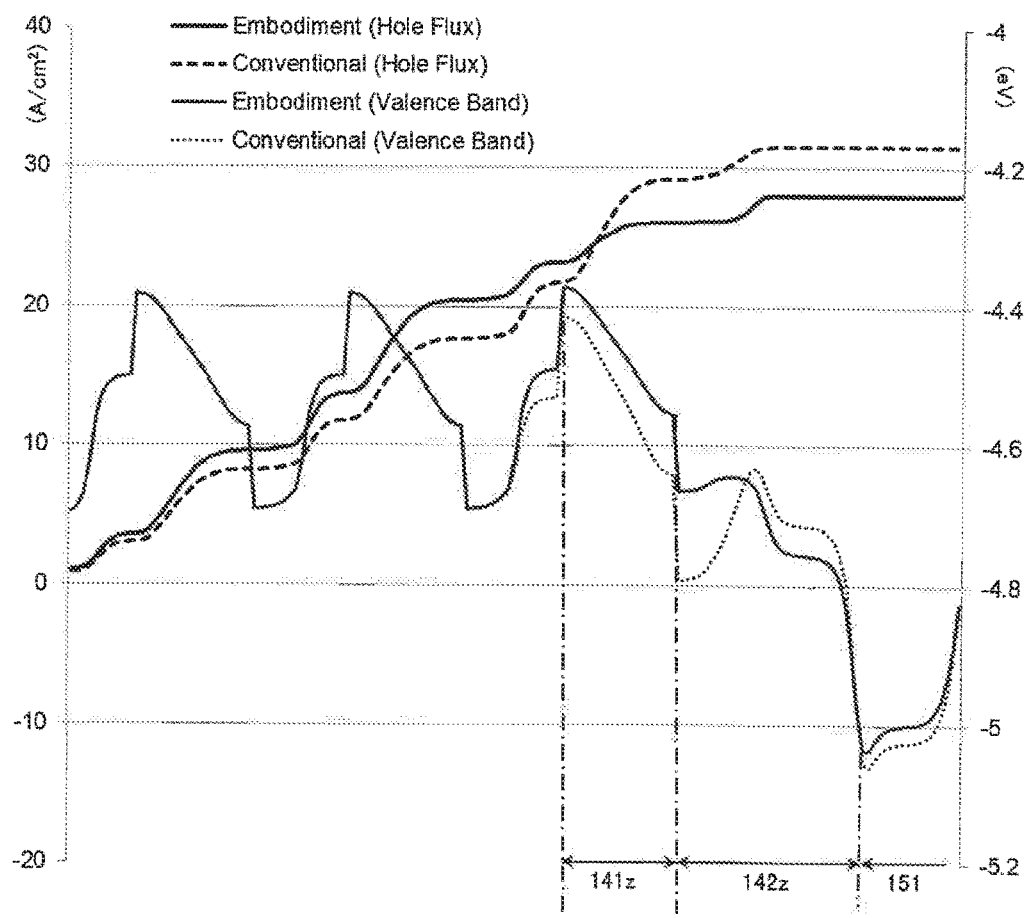
FIG. 5 is a graph showing the hole fluxes and the valence bands of the semiconductor light-emitting devices of the first embodiment and the conventional example.

FIG. 5 is a graph comparing the hole fluxes between the semiconductor light-emitting device of the first embodiment and the conventional light-emitting device 100. Same as FIG. 4B, the light-emitting layer 140 and the vicinity of the light-emitting layer 140 are extracted. The horizontal axis of FIG. 5 indicates positions in a semiconductor deposition direction perpendicular to the plate surface of the substrate in the light-emitting device. The left vertical axis of FIG. 5 indicates the hole fluxes and the right vertical axis indicates the energy level of the valence band. In FIG. 5, the hole fluxes are plotted in addition to the energy level of the valence bands of FIG. 4B. The solid lines of FIG. 5 indicate the energy level of the valence band and the hole fluxes of the light-emitting device 100 of the first embodiment. The dotted lines of FIG. 5 indicate the energy level of the valence band and the hole fluxes of the conventional light-emitting device. These show the values obtained by simulation.

As shown in FIG. 5, in the light-emitting device 100 of the first embodiment, there are enough hole fluxes inside the well layers 141 nearer to the last barrier layer 142z. On the other hand, in the conventional light-emitting device, the well layer, i.e., corresponding to the last well layer 141z, adjacent to the barrier layer closest to the electron blocking layer has sufficient hole fluxes. However, the well layer disposed at a position distant from the electron blocking layer does not have sufficient hole fluxes.

Thus, the structure of the last barrier layer 142z and the electron blocking layer 150 in the first embodiment can achieve a light-emitting device 100 which can prevent the lowering of barrier in the last barrier layer 142z and improve the hole injection efficiency to the well layers 141.

5. Experiments

In the experiments, the Al composition ratios at a position k1 between the last well layer 141z and the last barrier layer 142z was fixed at 0.65 (65%) and 0.61 (61%), and the Al composition ratio at a position k2 between the last barrier layer 142z and the first electron blocking layer 151 of the electron blocking layer 150 was varied, and the product of internal quantum efficiency (IQE) and injection efficiency (IE) was measured. That is, the product of internal quantum efficiency (IQE) and injection efficiency (IE) was measured with the Al composition ratio at the second position k2 of FIG. 3 varied.

Generally, in the deep ultraviolet light-emitting device, the hole concentration tends to be insufficient in the vicinity of the well layer compared to the light-emitting device that emits light having a wavelength of visible light. Therefore, the injection efficiency (IE) is important in the deep ultraviolet light-emitting device.

Figure 6:
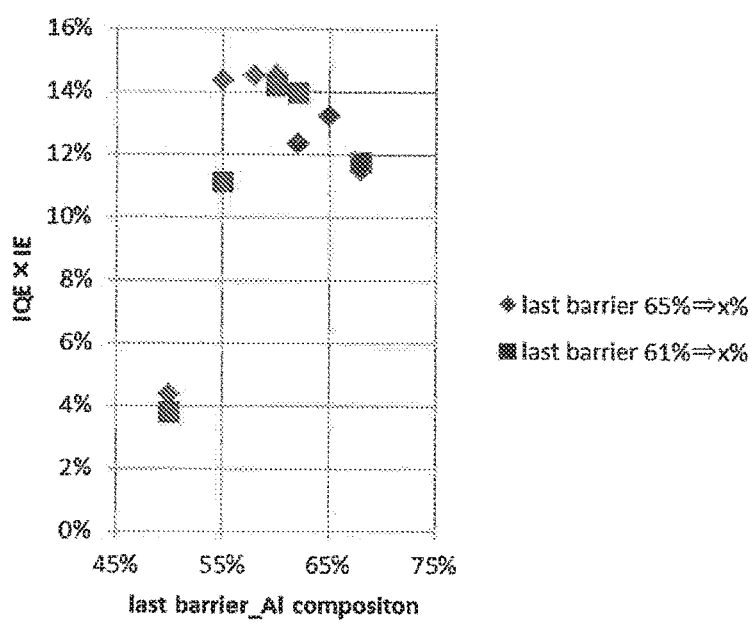
FIG. 6 is a graph showing the relationship between the Al composition ratio of the last barrier layer and the product of the internal quantum efficiency (IQE) and the injection efficiency (IE).

FIG. 6 is a graph showing the relationship between the Al composition ratio at the second position k2 of the last barrier layer 142z and the product of internal quantum efficiency (IQE) and injection efficiency (IE). The horizontal axis of FIG. 6 indicates the Al composition ratio at the second position k2 of FIG. 3. The vertical axis of FIG. 6 indicates the product of internal quantum efficiency (IQE) and injection efficiency (IE). The plots with the mark of "♦" show the product of IQE and IE when the Al composition ratio at the position k1 is fixed at 0.65 (65%) and the Al composition ratio at the position k3 is fixed at 0.80 (80%). The plots with the mark of "■" show the product of IQE and IE when the Al composition ratio at the position k1 is fixed at 0.61 (61%) and the Al composition ratio at the position k3 is fixed at 0.80 (80%).

As shown in FIG. 6, when the Al composition ratio at the second position k2 is 55% to 65%, the product value of internal quantum efficiency (IQE) and injection efficiency (IE) is improved.

6. Variations 6-1. Flip-chip

The light-emitting device 100 of the first embodiment is a face-up-type light-emitting device. However, alternatively, the techniques of the specification may be applied to a flip-chip type light-emitting device.

6-2. Deposition Structure

The deposition structure of the semiconductor layer may be any structure other than the structure of the above embodiment.

6-3. Conduction Type

In the first embodiment, the n-type semiconductor layer is a first conductive type first semiconductor layer. The p-type semiconductor layer is a second conductive type second semiconductor layer. The first conductive type first semiconductor layer is on the substrate side, however, the second conductive type second semiconductor layer may be on the substrate side.

6-4. Combination

The aforementioned variations may be combined with one another without any restriction.

7. Summary of the Embodiment

As described above, in the light-emitting device 100 of the embodiment, the Al composition ratio between the last barrier layer 142z and the first electron blocking layer 151 is adjusted. That is, the Al composition ratio between the last barrier layer 142z and the first electron blocking layer 151 decreases from the first position k1 to the second position k2, and increases from the second position k2 to the third position k3. Therefore, electrons are hard to leak into the electron blocking layer 150 in the front of the last barrier layer 142z, and holes are easy to be injected in the well layer 141.

A. Note

In a first aspect of the present techniques, there is provided a Group III nitride semiconductor light-emitting device including a first conductive type first semiconductor layer, a light-emitting layer on the first semiconductor layer, and a second conductive type second semiconductor layer on the light-emitting layer. The light-emitting layer has a plurality of barrier layers and well layers. The second semiconductor layer has an electron blocking layer. A plurality of barrier layers has a last barrier layer closest to the electron blocking layer. The electron blocking layer has a first electron blocking layer closest to the light-emitting layer. The last barrier layer has a first position farthest from the first electron blocking layer and a second position as an interface with the first electron blocking layer. The first electron blocking layer has a third position farthest from the last barrier layer. The Al composition ratio at the first position is higher than the Al composition ratio at the second position. The Al composition ratio at the third position is higher than the Al composition ratio at the first and second positions.

A second aspect of the techniques is directed to a specific embodiment of the Group III nitride semiconductor light-emitting device, wherein the Al composition ratio in the last barrier layer decreases from the first position to the second position, and the Al composition ratio in the first electron blocking layer increases from the second position to the third position.

A third aspect of the techniques is directed to a specific embodiment of the Group III nitride semiconductor light-emitting device, wherein the Al composition ratio at the second position is any value in arrange from 55% to 65%.

In a fourth aspect of the present techniques, there is provided a method for producing a Group III nitride semiconductor light-emitting device, the method comprising steps of forming a first conductive type first semiconductor layer, forming a light-emitting layer on the first semiconductor layer, and forming a second conductive type second semiconductor layer on the light-emitting layer. The light-emitting layer formation step includes a barrier layer formation step of forming a plurality of barrier layers, and a well layer formation step of forming a plurality of well layers. The second semiconductor layer formation step includes an electron blocking layer formation step of forming an electron blocking layer. In the barrier layer formation step, a last barrier layer is formed at a position farthest from the first semiconductor layer. In the electron blocking layer formation step, a first electron blocking layer is formed in adjacent to the last barrier layer after the formation of the last barrier layer 142z. When the last barrier layer is formed, a first position farthest from the first electron blocking layer and a second position as an interface with the first electron blocking layer are formed. When the first electron blocking layer is formed, a third position farthest from the last barrier layer is formed. The Al composition ratio at the first position is higher than the Al composition ratio at the second position. The Al composition ratio at the third position is higher than the Al composition ratio at the first and second positions.

A fifth aspect of the techniques is directed to a specific embodiment of the Group III nitride semiconductor light-emitting device production method, wherein the Al composition ratio between the last barrier layer and the first electron blocking layer decreases from the first position to the second position, and increases from the second position to the third position.

A sixth aspect of the techniques is directed to a specific embodiment of the Group III nitride semiconductor light-emitting device production method, wherein the Al composition ratio at the second position is 55% to 65%.

What is claimed is:

1. A Group III nitride semiconductor fight-emitting device including:
    a first conductive type first semiconductor layer;
    a light-emitting on the first semiconductor layer; and
    a second conductive type second semiconductor layer on the light-emitting layer,
    wherein the light-emitting layer has a plurality of barrier layers and well layers,
    wherein the second semiconductor layer has an electron blocking layer,
    wherein the plurality of barrier layers has a last barrier layer closest to the electron blocking layer,
    wherein the electron blocking layer has a first electron blocking layer closest to the light-emitting layer,
    wherein the last barrier layer has a first position farthest from the first electron blocking layer and a second position as an interface with the first electron block layer,
    wherein the first electron blocking layer has a third position farthest from the last barrier layer,
    wherein an Al composition ratio at the first position is higher than an Al composition ratio at the second position, and
    wherein Al composition ratio at the third position is higher than the Al composition ratio at the first and second positions.

2. The Group III nitride semiconductor light-emitting device according to claim 1, wherein an Al composition ratio in the last barrier layer decreases from the first position to the second position, and an Al composition ratio in the first electron blocking layer increases from the second position to the third position.

3. The Group III nitride semiconductor light-emitting device according to claim 1, wherein the Al composition ratio at the second position is any value in a range from 55% to 65%.

4. The Group III nitride semiconductor light-emitting device according to claim 2, wherein the Al composition ratio at the second position is any value in a range from 55% to 65%.

5. The Group III nitride semiconductor light-emitting device according to claim 2, wherein the Al composition ratio in the last barrier layer linearly decreases from the first position to the second position.

6. The Group III nitride semiconductor light-emitting device according to claim 2, wherein the Al composition ratio in the first electron blocking layer linearly increases from the second position to the third position.

7. The Group III nitride semiconductor light-emitting device according to claim 5, wherein the Al composition ratio in the first electron blocking layer linearly increases from the second position to the third position.

8. The Group III nitride semiconductor light-emitting device according to claim 7, wherein the Al composition ratio at the second position is any value in a range from 55% to 65%.

9. The Group III nitride semiconductor light-emitting device according to claim 1, wherein the Al composition ratio at the first position is any value in a range from 61% to 68%.

10. The Group III nitride semiconductor light-emitting device according to claim 1, wherein the Al composition ratio at the third position is any value in a range from 75% to 85%.

11. The Group III nitride semiconductor light-emitting device according to claim 1, wherein an Al composition ratio at a fourth position is any value in a range from 57% to 62%, the fourth position being a boundary between a last well layer closest to the last barrier layer and a barrier layer nearest from the last well layer.

12. The Group III nitride semiconductor light-emitting device according to claim 8, wherein the Al composition ratio at the first position is any value in a range from 61% to 68%.

13. The Group III nitride semiconductor light-emitting device according to claim 12, wherein the Al composition ratio at the third position is any value in a range from 75% to 85%.

14. The Group III nitride semiconductor light-emitting device according to claim 13, wherein the Al composition ratio at a fourth position is any value in a range from 57% to 62%, the fourth position being a boundary between a last well layer closest to the last barrier layer and a barrier layer nearest from the last well laver.

15. The Group III nitride semiconductor light-emitting device according to claim 2, wherein the Al composition ratio varies in a U-shape from the first position to the third position through the second position.

16. The Group III nitride semiconductor light-emitting device according to claim 15, wherein the Al composition ratio at the second position is any value in a range from 55% to 65%.

17. The Group III nitride semiconductor light-emitting device according to claim 14, wherein the Al composition ratio varies in a figure of U-letter from the first position to the third position through the second position.

\* \* \* \* \*